(12) United States Patent  (10) Patent No.: US 8,394,663 B2
Harris et al.  (45) Date of Patent: Mar. 12, 2013

(54) HYBRID PHOTOVOLTAIC CELLS AND RELATED METHODS

(75) Inventors: James Harris, Manchester (GB); Nigel Pickett, East Croyden (GB)

(73) Assignee: Nanoco Technologies, Ltd. (GB)

( * ) Notice: Subject to any disclaimer, the term of this patent is extended or adjusted under 35 U.S.C. 154(b) by 155 days.

(21) Appl. No.: 13/015,316

(22) Filed: Jan. 27, 2011

(65) Prior Publication Data

US 2012/0028406 A1 Feb. 2, 2012

Related U.S. Application Data

(62) Division of application No. 12/108,976, filed on Apr. 24, 2008.

(60) Provisional application No. 60/926,103, filed on Apr. 25, 2007.

(51) Int. Cl.
*H01L 21/00* (2006.01)
(52) U.S. Cl. ............................. 438/94; 438/95
(58) Field of Classification Search .................. 438/57, 438/82, 85, 93, 95
See application file for complete search history.

(56) References Cited

U.S. PATENT DOCUMENTS

| 2,769,838 | A | 11/1956 | Matter et al. |
|---|---|---|---|
| 3,524,771 | A | 8/1970 | Green |
| 4,609,689 | A | 9/1986 | Schwartz et al. |
| 6,114,038 | A | 9/2000 | Castro et al. |
| 6,207,229 | B1 | 3/2001 | Bawendi et al. |
| 6,221,602 | B1 | 4/2001 | Barbera-guillem et al. |
| 6,261,779 | B1 | 7/2001 | Barbera-guillem et al. |
| 6,322,901 | B1 | 11/2001 | Bawendi et al. |
| 6,326,144 | B1 | 12/2001 | Bawendi et al. |
| 6,333,110 | B1 | 12/2001 | Barbera-guillem |
| 6,379,635 | B2 | 4/2002 | O'Brien et al. |
| 6,423,551 | B1 | 7/2002 | Weiss et al. |
| 6,426,513 | B1 | 7/2002 | Bawendi et al. |
| 6,607,829 | B1 | 8/2003 | Bawendi et al. |
| 6,660,379 | B1 | 12/2003 | Lakowicz et al. |
| 6,699,723 | B1 | 3/2004 | Weiss et al. |
| 6,743,936 | B1 * | 6/2004 | Wellinghoff et al. ......... 556/405 |
| 6,815,064 | B2 | 11/2004 | Treadway et al. |
| 6,846,565 | B2 * | 1/2005 | Korgel et al. ................. 428/402 |
| 6,855,551 | B2 | 2/2005 | Bawendi et al. |
| 6,914,264 | B2 | 7/2005 | Chen et al. |
| 6,918,946 | B2 * | 7/2005 | Korgel et al. .................... 75/362 |
| 6,936,761 | B2 * | 8/2005 | Pichler .......................... 136/256 |
| 6,946,597 | B2 * | 9/2005 | Sager et al. .................... 136/263 |
| 6,987,071 | B1 * | 1/2006 | Bollman et al. .............. 438/780 |

(Continued)

FOREIGN PATENT DOCUMENTS

| CN | 1394599 | 2/2003 |
|---|---|---|
| EP | 1176646 | 1/2002 |

(Continued)

OTHER PUBLICATIONS

Agger, J.R. et al., J. Phys. Chem. B (1998) 102, p. 3345.

(Continued)

*Primary Examiner* — David Vu
*Assistant Examiner* — Earl Taylor
(74) *Attorney, Agent, or Firm* — Wong, Cabello, Lutsch, Rutherford & Brucculeri LLP

(57) ABSTRACT

Embodiments of the present invention involve photovoltaic (PV) cells comprising a semiconducting nanorod-nanocrystal-polymer hybrid layer, as well as methods for fabricating the same. In PV cells according to this invention, the nanocrystals may serve both as the light-absorbing material and as the heterojunctions at which excited electron-hole pairs split.

8 Claims, 4 Drawing Sheets

U.S. PATENT DOCUMENTS

| | | | |
|---|---|---|---|
| 6,992,202 B1 | 1/2006 | Banger et al. | |
| 7,151,047 B2 | 12/2006 | Chan et al. | |
| 7,227,066 B1* | 6/2007 | Roscheisen et al. | 257/40 |
| 7,235,361 B2 | 6/2007 | Bawendi et al. | |
| 7,253,017 B1* | 8/2007 | Roscheisen et al. | 438/57 |
| 7,264,527 B2 | 9/2007 | Bawendi et al. | |
| 7,291,782 B2* | 11/2007 | Sager et al. | 136/250 |
| 7,341,774 B2* | 3/2008 | Kalkan et al. | 428/119 |
| 7,462,774 B2* | 12/2008 | Roscheisen et al. | 136/256 |
| 7,511,217 B1* | 3/2009 | Roscheisen et al. | 136/263 |
| 7,544,725 B2 | 6/2009 | Pickett et al. | |
| 7,588,752 B2 | 9/2009 | O'Brien et al. | |
| 7,594,982 B1* | 9/2009 | Roscheisen et al. | 204/284 |
| 7,605,327 B2* | 10/2009 | Roscheisen et al. | 136/263 |
| 7,645,934 B1* | 1/2010 | Fidanza et al. | 136/263 |
| 7,674,844 B2 | 3/2010 | Pickett et al. | |
| 7,722,953 B2* | 5/2010 | Korgel et al. | 428/403 |
| 7,772,487 B1* | 8/2010 | Robinson | 136/263 |
| 7,803,423 B2 | 9/2010 | O'Brien et al. | |
| 7,867,556 B2 | 1/2011 | Pickett | |
| 7,867,557 B2 | 1/2011 | Pickett et al. | |
| 7,893,348 B2* | 2/2011 | Korevaar et al. | 136/255 |
| 8,003,883 B2* | 8/2011 | Korevaar et al. | 136/255 |
| 2003/0003300 A1* | 1/2003 | Korgel et al. | 428/402 |
| 2003/0017264 A1 | 1/2003 | Treadway et al. | |
| 2003/0034486 A1* | 2/2003 | Korgel | 257/13 |
| 2003/0106488 A1 | 6/2003 | Huang et al. | |
| 2003/0148024 A1 | 8/2003 | Kodas et al. | |
| 2004/0007169 A1 | 1/2004 | Ohtsu et al. | |
| 2004/0036130 A1 | 2/2004 | Lee et al. | |
| 2004/0109666 A1* | 6/2004 | Kim, II | 385/147 |
| 2004/0110002 A1 | 6/2004 | Kim et al. | |
| 2004/0110347 A1 | 6/2004 | Yamashita | |
| 2004/0178390 A1 | 9/2004 | Whiteford et al. | |
| 2004/0187917 A1* | 9/2004 | Pichler | 136/263 |
| 2004/0250745 A1 | 12/2004 | Ogura et al. | |
| 2005/0098204 A1* | 5/2005 | Roscheisen et al. | 136/263 |
| 2005/0098205 A1* | 5/2005 | Roscheisen et al. | 136/263 |
| 2005/0121068 A1* | 6/2005 | Sager et al. | 136/252 |
| 2005/0129947 A1 | 6/2005 | Peng et al. | |
| 2005/0145853 A1 | 7/2005 | Sato et al. | |
| 2005/0183767 A1 | 8/2005 | Yu et al. | |
| 2005/0266697 A1* | 12/2005 | Korgel et al. | 438/758 |
| 2005/0267345 A1* | 12/2005 | Korgel et al. | 600/317 |
| 2006/0019098 A1 | 1/2006 | Chan et al. | |
| 2006/0057382 A1 | 3/2006 | Treadway et al. | |
| 2006/0061017 A1 | 3/2006 | Strouse et al. | |
| 2006/0068154 A1 | 3/2006 | Parce et al. | |
| 2006/0110279 A1 | 5/2006 | Han et al. | |
| 2006/0118757 A1 | 6/2006 | Klimov et al. | |
| 2006/0130741 A1 | 6/2006 | Peng et al. | |
| 2007/0012941 A1 | 1/2007 | Cheon | |
| 2007/0034833 A1 | 2/2007 | Parce et al. | |
| 2007/0059705 A1 | 3/2007 | Lu et al. | |
| 2007/0104865 A1 | 5/2007 | Pickett | |
| 2007/0110816 A1 | 5/2007 | Jun et al. | |
| 2007/0114520 A1 | 5/2007 | Garditz et al. | |
| 2007/0125983 A1 | 6/2007 | Treadway et al. | |
| 2007/0131905 A1 | 6/2007 | Sato et al. | |
| 2007/0137697 A1* | 6/2007 | Kempa et al. | 136/256 |
| 2007/0199109 A1 | 8/2007 | Yi et al. | |
| 2007/0202333 A1 | 8/2007 | O'Brien et al. | |
| 2007/0238126 A1 | 10/2007 | Pickett et al. | |
| 2008/0047604 A1* | 2/2008 | Korevaar et al. | 136/258 |
| 2008/0107911 A1 | 5/2008 | Liu et al. | |
| 2008/0110486 A1* | 5/2008 | Tsakalakos et al. | 136/244 |
| 2008/0112877 A1 | 5/2008 | Xiao et al. | |
| 2008/0121844 A1 | 5/2008 | Jang et al. | |
| 2008/0135089 A1* | 6/2008 | Tsakalakos et al. | 136/248 |
| 2008/0160306 A1 | 7/2008 | Mushtaq et al. | |
| 2008/0169019 A1* | 7/2008 | Korevaar et al. | 136/251 |
| 2008/0190483 A1 | 8/2008 | Carpenter et al. | |
| 2008/0220593 A1 | 9/2008 | Pickett et al. | |
| 2008/0257201 A1 | 10/2008 | Harris et al. | |
| 2008/0264479 A1 | 10/2008 | Harris et al. | |
| 2009/0139574 A1 | 6/2009 | Pickett et al. | |
| 2009/0212258 A1 | 8/2009 | Mccairn et al. | |
| 2009/0263816 A1 | 10/2009 | Pickett et al. | |
| 2010/0059721 A1 | 3/2010 | Pickett et al. | |
| 2010/0068522 A1 | 3/2010 | Pickett et al. | |
| 2010/0113813 A1 | 5/2010 | Pickett et al. | |
| 2010/0123155 A1 | 5/2010 | Pickett et al. | |
| 2010/0193767 A1 | 8/2010 | Naasani et al. | |
| 2010/0212544 A1 | 8/2010 | Harris et al. | |

FOREIGN PATENT DOCUMENTS

| | | |
|---|---|---|
| EP | 1783137 | 5/2007 |
| EP | 1854792 | 11/2007 |
| GB | 1995-18910.6 | 9/1995 |
| GB | 2429838 | 3/2007 |
| JP | 2005/139389 | 6/2005 |
| WO | WO-97/10175 | 3/1997 |
| WO | WO-00/17642 | 3/2000 |
| WO | WO-02/04527 | 1/2002 |
| WO | WO-02/24623 | 3/2002 |
| WO | WO-02/29140 | 4/2002 |
| WO | WO-03/099708 | 12/2003 |
| WO | WO-2004/008550 | 1/2004 |
| WO | WO-2004/033366 | 4/2004 |
| WO | WO-2004/065362 | 8/2004 |
| WO | WO-2004/066361 | 8/2004 |
| WO | WO-2005/021150 | 3/2005 |
| WO | WO-2005/106082 | 11/2005 |
| WO | WO-2005/123575 | 12/2005 |
| WO | WO-2006/001848 | 1/2006 |
| WO | WO-2006/017125 | 2/2006 |
| WO | WO-2006/073437 | 7/2006 |
| WO | WO-2006/075974 | 7/2006 |
| WO | WO-2006/101986 | 9/2006 |
| WO | WO-2006/116337 | 11/2006 |
| WO | WO-2006/118543 | 11/2006 |
| WO | WO-2006/134599 | 12/2006 |
| WO | WO-2007/020416 | 2/2007 |
| WO | WO-2007/049052 | 5/2007 |
| WO | WO-2007/060591 | 5/2007 |
| WO | WO-2007/065039 | 6/2007 |
| WO | WO-2007/098378 | 8/2007 |
| WO | WO-2007/102799 | 9/2007 |
| WO | WO-2008/013780 | 1/2008 |
| WO | WO-2008/054874 | 5/2008 |
| WO | WO-2008/133660 | 11/2008 |
| WO | WO-2009/016354 | 2/2009 |
| WO | WO-2009/040553 | 4/2009 |
| WO | WO-2009/106810 | 9/2009 |

OTHER PUBLICATIONS

Aldana, J. et al. "Photochemical Instability of CdSe Nanocrystals Coated by Hydrophilic Thiols", J. Am. Chem. Soc. (2001), 123: 8844-8850.

Alivisatos, A.P. "Perspectives on the Physical Chemistry of Semiconductor Nanocrystals", J. Phys. Chem., (1996), 100, pp. 13226-13239.

Arici et al., Thin Solid Films 451-452 (2004) 612-618.

Battaglia et al., "Colloidal Two-dimensional Systems: CdSe Quantum Shells and Wells," Angew Chem. (2003) 115:5189.

Bawendi, M.G. The Quantum Mechanics of Larger Semiconductor Clusters ("Quantum Dots"), Annu. Rev. Phys. Chem. (1990), 42: 477-498.

Berry, C.R. "Structure and Optical Absorption of AgI Microcrystals", Phys. Rev. (1967) 161: 848-851.

Bunge, S.D. et al. "Growth and morphology of cadmium chalcogenides: the synthesis of nanorods, tetrapods, and spheres from CdO and Cd($O_2CCH_3$)$_2$", J. Mater. Chem. (2003) 13: 1705-1709.

Castro et al., Chem. Mater. (2003) 15:3142-3147.

Castro et al., "Synthesis and Characterization of Colloidal $CuInS_2$ Nanoparticles from a Molecular Single-Source Precursors," J. Phys. Chem. B (2004) 108:12429.

Chun et al., Thin Solid Films 480-481 (2005) 46-49.

Contreras et al., "ZnO/ZnS(O,OH)/Cu(In,Ga)$Se_2$/Mo Solar Cell with 18:6% Efficiency," from 3d World Conf. on Photovol. Energy Conv., Late News Paper, (2003) pp. 570-573.

Cui et al., "Harvest of near infrared light in PbSe nanocrystal-polymer hybrid photovoltaic cells," Appl. Physics Lett. 88 (2006) 183111-183111-3.

Cumberland et al., "Inorganic Clusters as Single-Source Precursors for Preparation of CdSe, ZnSe, and CdSe/ZnS Nanomaterials" Chemistry of Materials, 14, pp. 1576-1584, (2002).

Dance et al., J. Am. Chem. Soc. (1984) 106:6285.

Daniels et al., "New Zinc and Cadmium Chalcogenide Structured Nanoparticles," Mat. Res. Soc. Symp. Proc. 789 (2004).

Eychmüller, A. et al. "A quantum dot quantum well: CdS/HgS/CdS", Chem. Phys. Lett. 208, pp. 59-62 (1993).

Fendler, J.H. et al. "The Colloid Chemical Approach to Nanostructured Materials", Adv. Mater. (1995) 7: 607-632.

Gao, M. et al. "Synthesis of PbS Nanoparticles in Polymer Matrices", J. Chem. Soc. Commun. (1994) pp. 2779-2780.

Gou et al., J. Am. Chem. Soc. (2006) 128:7222-7229.

Gur et al., "Air stable all-inorganic nanocrystal solar cells processed from solution," Lawrence Berkeley Natl. Lab., Univ. of California, paper LBNL-58424 (2005).

Gurin, Colloids Surf. A (1998) 142:35-40.

Guzelian, A. et al. "Colloidal chemical synthesis and characterization of InAs nanocrystal quantum dots", Appl. Phys. Lett. (1996) 69: 1432-1434.

Guzelian, A. et al., J. Phys. Chem. (1996) 100: 7212.

Hagfeldt, A. et al. "Light-induced Redox Reactions in Nanocrystalline Systems", Chem. Rev. (1995) 95: 49-68.

Henglein, A. "Small-Particle Research: Physicochemical Properties of Extremely Small Colloidal Metal and Semiconductor Particles", Chem Rev. (1989) 89: 1861-1873.

Hirpo et al., "Synthesis of Mixed Copper-Indium Chalcogenolates. Single-Source Precursors for the Photovoltaic Materials CuInQ2 (Q=S, Se)," J. Am. Chem. Soc. (1993) 115:1597.

Hu et al., Sol. State Comm. (2002) 121:493-496.

International Search Report for PCT/GB2005/001611 mailed Sep. 8, 2005 (5 pages).

Jegier, J.A. et al. "Poly(imidogallane): Synthesis of a Crystalline 2-D Network Solid and Its Pyrolysis to Form Nanocrystalline Gallium Nitride in Supercritical Ammonia", Chem. Mater. (1998) 10: 2041-2043.

Jiang et al., Inorg. Chem. (2000) 39:2964-2965.

Kaelin et al., "CIS and CIGS layers from selenized nanoparticle precursors," Thin Solid Films 431-432 (2003) pp. 58-62.

Kapur et al., "Non-Vacuum processing of $CuIn_{1-x}Ga_xSe_2$ solar cells on rigid and flexible substrates using nanoparticle precursor inks," Thin Solid Films 431-432 (2003) pp. 53-57.

Kher, S. et al. "A Straightforward, New Method for the Synthesis of Nanocrystalline GaAs and GaP", Chem. Mater. (1994) 6: 2056-2062.

Kim et al., "Synthesis of CuInGaSe2 Nanoparticles by Low Temperature Colloidal Route," J. Mech. Sci. Tech., Vo. 19, No. 11, pp. 2085-2090 (2005).

Law et al., "Nanowire dye-sensitized solar cells," Nature Mater. (2005) vol. 4 pp. 455-459.

Li et al., Adv. Mat. (1999) 11:1456-1459.

Lieber, C. et al. "Understanding and Manipulating Inorganic Materials with Scanning Probe Microscopes", Angew. Chem. Int. Ed. Engl. (1996) 35: 687-704.

Little et al., "Formation of Quantum-dot quantum-well heteronanostructures with large lattice mismatch: Zn/CdS/ZnS," 114 J. Chem. Phys. 4 (2001).

Lu et al., Inorg. Chem. (2000) 39:1606-1607.

LØver, T. et al. "Preparation of a novel CdS nanocluster material from a thiophenolate-capped CdS cluster by chemical removal of SPh ligands", J. Mater. Chem. (1997) 7(4): 647-651.

Malik et al., Adv. Mat., (1999) 11:1441-1444.

Matijevic, E., "Monodispersed Colloids: Art and Science", Langmuir (1986) 2:12-20.

Matijevic, E. "Production of Mondispersed Colloidal Particles", Ann. Rev. Mater. Sci. (1985) 15: 483-518.

Mekis, I. et al., "One-Pot Synthesis of Highly Luminescent CdSe/CdS Core-Shell Nanocrystals via Organometallic and "Greener" Chemical Approaches", J. Phys. Chem. B. (2003) 107: 7454-7462.

Mews et al., J. Phys. Chem. (1994) 98:934.

Micic et al., "Synthesis and Characterization of InP, GaP, and $GaInP_2$ Quantum Dots", J. Phys. Chem. (1995) pp. 7754-7759.

Milliron et al., "Electroactive Surfactant Designed to Mediate Electron Transfer between CdSe Nanocrystals and Organic Semiconductors," Adv. Materials (2003) 15, No. 1, pp. 58-61.

Murray, C.B. et al., "Synthesis and Characterization of Nearly Monodisperse CdE (E=S, Se, Te) Semiconductor Nanocrystallites", J. Am. Chem. Soc. (1993) 115 (19) pp. 8706-8715.

Nairn et al., Nano Letters (2006) 6:1218-1223.

Nazeeruddin et al., "Conversion of Light to Electricity by cis-X2Bis(2,2'bipyridyl-4,4'-dicarboxylate)ruthenium(II) Charge-Transfer Sensitizers (X=Cl-, Br-, I-, CN-, and SCN-) on Nanocrystalline $TiO_2$ Electrodes," J. Am. Chem. Soc. (1993) 115:6382-6390.

Nazeeruddin et al., "Engineering of Efficient Panchromatic Sensitizers for Nanocrystalline TiO2-Based Solar Cells," J. Am. Chem. Soc. (2001) 123:1613-1624.

O'Brien et al., "The Growth of Indium Selenide Thin Films from a Novel Asymmetric Dialkydiselenocarbamate," 3 Chem. Vap. Depos. 4, pp. 227 (1979).

Olshaysky, M.A., et al. "Organometallic Synthesis of GaAs Crystallites Exhibiting Quantum Confinement", J. Am. Chem. Soc. (1990) 112: 9438-9439.

Olson et al., J. Phys. Chem. C. (2007) 111:16640-16645.

Patents Act 1977: Search Report under Section 17 for Application No. GB0409877.8 dated Oct. 7, 2004 (2 pages).

Patent Act 1977 Search Report under Section 17 for Application No. GB0522027.2 dated Jan. 27, 2006 (1 page).

Patent Act 1977 Search Report under Section 17 for Application No. GB0606845.6 dated Sep. 14, 2006.

Patent Act 1977 Search Report under Section 17 for Application No. GB0719073.9 dated Feb. 29, 2008.

Patent Act 1977 Search Report under Section 17 for Application No. GB0719075.4 dated Jan. 22, 2008.

Patent Act 1977 Search Report under Section 17 for Application No. GB0723539.3 dated Mar. 27, 2008 (1 page).

Peng et al., "Mechanisms of the Shape Evolution of CdSe Nanocrystals", J. AM. Chem. Soc. (2001) 123:1389.

Peng et al., "Kinetics of I-VI and III-V Colloidal Semiconductor Nanocrystal Growth: "Focusing" os Size Distributions", J. Am. Chem. Soc., (1998) 129: 5343-5344.

Peng et al., "Shape control of CdSe nanocrystals", Nature, (2000) vol. 404, No. 6773, pp. 59-61.

Pradhan, N. et al. "Single-Precursor, One-Pot Versatile Synthesis under near Ambient Conditions of Tunable, Single and Dual Band Flouresciong Metal Sulfide Nanoparticles", J. Am. Chem. Soc. (2003) 125: 2050-2051.

Qi et al., "Efficient polymer-nanocrystal quantum-dot photodetectors," Appl. Physics Lett. 86 (2005) 093103-093103-3.

Qu, L. et al. "Alternative Routes toward High Quality CdSe Nanocrystals", Nano Lett. (2001) vol. 1, No. 6, pp. 333-337.

Robel et al., "Quantum Dot Solar Cells. Harvesting Light Energy with CdSe Nanocrystals Molecularly Linked to Mesoscopic TiO2 Films," J. Am. Chem. Soc. (2006) 128: 2385-2393.

Salata, O.V. et al. "Uniform GaAs quantum dots in a polymer matrix", Appl. Phys. Letters (1994) 65(2): 189-191.

Sercel, P.C. et al. "Nanometer-scale GaAs clusters from organometallic percursors", Appl. Phys. Letters (1992) 61: 696-698.

Shulz et al., J. Elect. Mat. (1998) 27:433-437.

Steigerwald, M.L. et al. "Semiconductor Crystallites: A Class of Large Molecules", Acc. Chem. Res. (1990) 23: 183-188.

Stroscio, J.A. et al. "Atomic and Molecular Manipulation with the Scanning Tunneling Microscope", Science (1991), 254: 1319-1326.

Trinidade et al., "A Single Source Spproach to the Synthesis of CdSe Nanocrystallites", Advanced Materials, (1996) vol. 8, No. 2, pp. 161-163.

Vayssieres et al., "Highly Ordered $SnO_2$ Nanorod Arrays from Controlled Aqueous Growth," Angew. Chem. Int. Ed. (2004) 43: 3666-3670.

Wang Y. et al. "PbS in polymers, From molecules to bulk solids", J. Chem. Phys. (1987) 87: 7315-7322.

Weller, H. "Colloidal Semiconductor Q-Particles: Chemistry in the Transition Region Between Solid State and Molecules", Angew. Chem. Int. Ed. Engl. (1993) 32: 41-53.

Weller, H. "Quantized Semiconductor Particles: A Novel State of Mater for Materials Science", Adv. Mater. (1993) 5: 88-95.
Wells, R.L. et al. "Synthesis of Nanocrystalline Indium Arsenide and Indium Phosphide from Indium(III) Halides and Tris (trimethylsilyl)pnicogens. Synthesis, Characterization, and Decomposition Behavior of $I_3In-P(SiMe_3)_3$", Chem. Mater. (1995) 7: 793-800.
Xiao et al., J. Mater. Chem. (2001) 11:1417-1420.
Yang et al., Crystal Growth & Design (2007) 12:2562-2567.
Yu et al., "Polymer Photovoltaic Cells: Enhanced Efficiencies via a Network of Internal Donor-Acceptor Heterojunctions," 270 Science 5243 (1995), pp. 1789-1791.
Zhong et al., Nanotechnology 18 (2007) 025602.
Barron, "Group III Materials: New Phases and Nono-particles with Applications in Electronics and Optoelectronics," Office of Naval Research Final Report (1999).
Dabousi et al., "(CdSe)ZnS Core—Shell Quantum Dots: Synthesis and Characterization of a Size Series of Highly Luminescent Nanocrystallites," Jrl. Phys. Chem.,(1997) 101, pp. 9463-9475.
Dehnen et al., "Chalcogen-Bridged Copper Clusters," Eur. J. Inorg. Chem., (2002) pp. 279-317.
Eisenmann et al., "New Phosphido-bridged Multinuclear Complexes of Ag and Zn," Zeitschrift fur anorganische and allgemeine Chemi (1995). (1 page—abstract).
Müller et al., "From Giant Molecular Clusters and Precursors to Solid-state Structures," Current Opinion in Solid State and Materials Science, 4 (Apr. 1999) pp. 141-153.
Timoshkin, "Group 13 imido metallanes and their heavier analogs [RMYR']n (M=Al, Ga, In; Y=N, P, As, Sb)," Coordination Chemistry Reviews (2005).
Vittal, "The chemistry of inorganic and organometallic compounds with adameantane-like structures," Polyhedron, vol. 15, No. 10, pp. 1585-1642 (1996).
Zhong et al, "Composition-Tunable ZnxCu1-xSe Nanocrytals with High Luminescence and Stability", Jrl Amer. Chem. Soc. (2003).
International Search Report for PCT/GB2006/003028 mailed Jan. 22, 2007 (5 pages).
Nielsch et al., "Uniform Nickel Deposition into Ordered Alumina Pores by Pulsed Electrodeposition", Advanced Materials, 2000 vol. 12, No. 8, pp. 582-586.
Huang et al., "Bio-Inspired Fabrication of Antireflection Nanostructures by Replicating Fly Eyes", Nanotechnology (2008) vol. 19.
Materials Research Society Symposium Proceedings Quantum Dots, Nanoparticles and Nanowires, 2004, ISSN: 0272-9172.
Xie et. al., "Synthesis and Characterization of Highly Luminescent CdSe-Core CdS/Zn0.5Cd0.5S/ZnS Multishell Nanocrystals," JACS Articles published on web Apr. 29, 2005.
Kim et. al., "Engineering InAsxP1-x/InP/ZnSe III-V Alloyed Core-Shell Quantum Dots for the Near-Infrared," JACS Articles published on web Jul. 8, 2005.
Rao et. al. "The Chemistry of Nanomaterials: Synthesis, Properties and Applications" (2004).
Trinidade et al., "Nanocrystalline Seminconductors: Synthesis, Properties, and Perspectives", Chemistry of Materials, (2001) vol. 13, No. 11, pp. 3843-3858.
International Search Report for PCT/GB2009/001928 mailed Dec. 8, 2009 (3 pages).
International Search Report for PCT/GB2009/002605 mailed Feb. 22, 2010 (3 pages).
Search Report for GB0813273.0 searched Dec. 8, 2008 (1 page).
Search Report for GB0814458.6 searched Dec. 5, 2008 (2 pages).
Search Report for GB0820101.4 searched Mar. 3, 2009 (1 page).
Search Report for GB0821122.9 searched Mar. 19, 2009 (2 pages).
Foneberov et al., "Photoluminescence of tetrahedral quantum-dot quantum wells" Physica E, 26:63-66 (2005).
Cao, "Effect of Layer Thickness on the Luminescence Properties of ZnS/CdS/ZnS quantum dot quantum well", J. of Colloid and Interface Science 284:516-520 (2005).
Harrison et al. "Wet Chemical Synthesis on Spectroscopic Study of CdHgTe Nanocrystals with Strong Near-Infrared Luminescence" Mat. Sci and Eng.B69-70:355-360 (2000).
Sheng et al. "In-Situ Encapsulation of Quantum Dots into Polymer Microsphers", Langmuir 22(8):3782-3790 (2006).
W. Peter Wuelfing et al., "Supporting Information for Nanometer Gold Clusters Protected by Surface Bound Monolayers of Thiolated Poly (ethylene glycol) Polymer Electrolyte" Journal of the American Chemical Society (XP002529160) (1998).
International Search Report for PCT/GB2009/000510 mailed Jul. 6, 2010 (16 pages).
International Search Report for PCT/GB2008/003958 mailed Sep. 4, 2009 (4 pages).
Banger et al., "Ternary single-source precursors for polycrystalline thin-film solar cells" Applied Organometallic Chemistry, 16:617-627, XP002525473 Scheme 1 Chemical Synthesis (2002).
D Qi, M Fischbein, M Drndic, S. Selmic, "Efficient polymer-nanocrystal quantum-dot photodetectors", Appl. Phys. Lett., 2004, 84, 4295.
Shen et al., "Photoacoustic and photoelectrochemical characterization of CdSe-sensitized Ti02 electrodes composed of nanotubes and nanowires" Thin Solid Films, Elsevier-Sequoia S.A. Lausanne, CH vol. 499, No. 1-2, Mar. 21, 2006, pp. 299-305, XP005272241 ISSN: 0040-6090.
Smestad GP, et al., "A technique to compare polythiophene solid-state dye sensitized Ti02 solar cells to liquid junction devices" Solar Energy Materials and Solar Cells, Elsevier Science Publishers, Amsterdam, NL, vol. 76, No. 1, Feb. 15, 2003, pp. 85-105, XP004400821 ISSN: 0927-0248.
Chen et al., "Electrochemically synthesized CdS nanoparticle-modified Ti02 nanotube-array photoelectrodes: Preparation, characterization, and application to photoelectrochemical cells" Journal of Photochemistry and Photobiology, a: Chemistry, Elsevier Sequoia Lausanne, CH, vol. 177, No. 2-3, Jan. 25, 2006, pp. 177-184, XP005239590 ISSN: 1010-6030.
Wang, et al., "In situ polymerization of amphiphilic diacetylene for hole transport in solid state dye-sensitized solar cells" Organic Electronics, El Sevier, Amsterdam NL, vol. 7, No. 6, Nov. 18, 2006, pp. 546-550, XP005773063 ISSN: 1566-1199.
International Search Report and Written Opinion for PCT/GB2008/001457 mailed Aug. 21, 2008 (14 pages).
Richardson et al., "Chemical Engineering: Chemical and Biochemical Reactors and Process Control," vol. 3, Third Edition pp. 3-5 (1994).
Borchert et al., "High Resolution Photoemission STudy of CdSe and CdSe/ZnS Core-Shell Nanocrystals," Journal of Chemical Physics, vol. 119, No. 3, pp. 1800-1807 (2003).
Gaponik et al., "Thiol-Capping of CdTe Nanocrystals: An Alternative to Organometallic Synthetic Routes," Journal of Physical Chemistry B, vol. 106, No. 29, pp. 7177-7185 (2002).
Pickett et al., "Syntheses of Semiconductor Nanoparticles Using Single-Molecular Precursors," The Chemical Record, vol. 1 pp. 467-479 (2001).
Hu et al., Solar Cells: From basics to advanced systems. McGraw-Hill Book Co. pp. 73-74 (1983).
Talapin et al. "Synthesis of Surface-Modified Colloidal Semiconductor Nanocrystals and Study of Photoinduced Charge Separation and Transport in Nanocrystal-Polymer Composites," Physica E, vol. 14, pp. 237-241 (2002).
International Search Report and Written Opinion for International Application No. PCT/GB2008/001349 mailed Nov. 18, 2008 (16 pages).

* cited by examiner

HYBRID PHOTOVOLTAIC CELLS AND RELATED METHODS

CROSS-REFERENCE TO RELATED APPLICATIONS

This application is a divisional of U.S. application Ser. No. 12/108,976, filed on Apr. 24, 2008, which claims priority to and the benefits of U.S. Provisional Application Ser. No. 60/926,103, filed on Apr. 25, 2007, the entire disclosure of each of which is hereby incorporated by reference.

FIELD OF THE INVENTION

The present invention relates to solar cells and their fabrication, and in particular to nanorod-nanocrystal-polymer hybrid solar cells

BACKGROUND

To create useful electrical current from electromagnetic radiation, photovoltaic (PV) cells must absorb incident radiation such that an electron is promoted from the valence band to the conduction band (leaving a hole in the valence band), and must be able to separate the electron and hole and deliver these charge carriers to their respective electrodes before they recombine.

Many different strategies based on diverse materials have been employed, with varying degrees of success, to realize these basic behaviors with commercially satisfactory efficiency. Representative devices include crystalline inorganic solar cells (e.g., silicon, germanium, GaAs), nanocrystalline dye-sensitized solar cells, semiconductor-polymer solar cells, nanoparticle solar cells, and more recently, composite solar cells that incorporate and combine the aforementioned components from other strategies.

1. Inorganic Photovoltaics

Silicon is by far the most commonly used material for fabricating inorganic photovoltaics. These cells rely on the ability of silicon to absorb light and, consequently, to generate an excited electron-hole pair that is then separated at a p-n junction. The electric field set up by the p-n junction facilitates this separation because of the way electrons and holes move through materials: electrons move to lower energy levels while holes move to higher energy levels.

Creation of p-n junctions generally involves high-temperature processing in inert atmospheres to form very pure, crystalline silicon wafers, which are inflexible and expensive. Because silicon is an indirect semiconductor, a relatively thick layer is typically needed to achieve a good level of absorption, which increases material costs further. Efficiencies for the most pure (and expensive) silicon photovoltaics are on the order of 20%; efficiencies for the cheaper amorphous silicon cells are approximately 5-10%.

Today's commercial PV systems can convert from 5% to 15% of sunlight energy into electricity. These systems are highly reliable and generally last 20 years or longer. The possibility of fabricating solar cells by less expensive, lower-temperature techniques is very attractive. Accordingly, nanocrystalline dye-sensitized solar cells (DSSCs), semiconductor-polymer solar cells and nanoparticle solar cells have enjoyed widespread interest.

2. Polymer Photovoltaics

Semiconducting polymers can be used to make organic photovoltaics. The properties of these polymers can be tuned by functionalization of the constituent monomers. As such, a wide range of polymers with suitable bandgaps, absorption characteristics and physical properties is available. In order to achieve separation of the electron-hole pair, organic photovoltaics rely on donor-acceptor heterojunctions. In polymers, the excited-state electron and hole are bound together, and travel together, as a quasi-particle called an exciton. They remain together until they encounter a heterojunction, which separates them. Unfortunately, excitons are very short-lived and can only travel about 10 nm before recombining. Hence, any photon absorbed more than this diffusion length away from a heterojunction will be wasted. Charge mobilities for polymers are typically low (0.5–0.1 $cm^2 V^{-1} s^{-1}$) compared to silicon, which is much higher (1500 $cm^2 V^{-1} s^{-1}$). Current state-of-the-art polymer photovoltaic cells have efficiencies of 1-2%. Although such efficiencies are low, these materials hold promise for low-cost, flexible solar cells.

3. Nanoparticle Photovoltaics

Inorganic nanoparticles (or nanocrystals) have been used to prepare colloidal, thin-film PV cells that show some of the advantages of polymer photovoltaics while maintaining many of the advantages of inorganic photovoltaics. For example, such cells can contain a bi-layer structure comprising a layer of donor and a layer of acceptor nanoparticles, wherein the two layers exhibit little intermixing, and both contribute to the measured photocurrent. The strong photo-conductive effect exhibited by these devices suggests that these materials have a large number of trapped carriers and are better described by a donor-acceptor molecular model than by a p-n band model. Increased bandgap energy compared to that of the bulk semiconductors minimizes the number of carriers available, and spatial separation of the donor and acceptor particles in different phases traps the excitons so that they must split at the donor-acceptor heterojunction. There is no band-bending, so splitting of the exciton is more difficult.

It should be stressed that simply blending the donor and acceptor nanoparticles together will not create a film that produces a photovoltage. The lack of selectivity at the electrode towards one particle or another means that the electrodes can make contact with both the donor and acceptor species. These species may take the form of nanorods rather than nanospheres because nanorods with high aspect ratios help to disperse the carriers. Quick transfer of the exciton along the length of the nanorods improves the chance of splitting the exciton at the donor-acceptor heterojunction.

Solution processing of, for example, CdSe rods can achieve a size distribution of 5% in diameter and 10% in length with an aspect ratio of 20 and a length of 100 nm. The substantial control available through solution processing allows for optimization of the cell by variation of nanorod length and bandgap energy.

4. Polymer-Nanocrystal Composite Photovoltaics

The combination of nanomaterials and polymer films has been shown to give good power conversion efficiencies while affording low-temperature solution processes for fabrication. In one approach, nanomaterials are used to conduct charges while the polymer is used as the absorbing material, or alternatively, the nanomaterial serves as a chromophore, i.e., the light absorber, and the semiconductor polymer is employed as a hole conductor. In the former case, a wide-bandgap semiconductor (e.g., $TiO_2$) receives the excited electron from the conduction band of the chromophoric polymer semiconductor; and in the latter case, light-absorbing semiconductor nanocrystals absorb photons and transfer the resulting negative charge to the transparent primary electrode, while the semiconducting polymer transfers the holes to the counter electrode. In both types of cell, a heterojunction between the nanocrystal and the polymer separates the exciton created in the nanocrystal or polymer. The electron is transferred to the conduction band of the nanocrystal and the hole stays in the valence band of the polymer, or the electron stays in the conduction band of the nanocrystal, and the hole is transferred to the valence band of the polymer.

4.1 Wide-Bandgap Nanocrystal/Light-Absorbing Polymer

The active layer in a polymer-nanocrystal cell has two components: a light absorber and a nanoparticulate electron carrier. Typically, the light absorber is a p-type polymeric conductor, e.g., poly(phenylene vinylene) or poly(3-hexylthiophene), and the nanoparticulate electron carrier is a wide-bandgap semiconductor such as ZnO or $TiO_2$. In this configuration, the polymer serves to absorb light, to transfer electrons to the electron acceptor/carrier, and to carry holes to the primary electrode. The electron acceptor accepts electrons and transfers the electrons to the metal back contact.

The morphology of the phase separation is crucial. For example, a bi-layer structure in which each layer has only one component results in a cell with poor performance. The reason is that the lifetime of the excited state of the light-absorbing polymer is generally shorter than the transfer rate of the exciton to the interface, and, consequently, the majority of the excitons formed in the bulk of the polymer never reach the interface separating electrons and holes, resulting in loss of photocurrent. Morphologies in which a bulk heterojunction is formed tend to show greater efficiencies. If the absorber and electron acceptor are in intimate contact throughout the entire active layer, the shorter exciton path length will result in increased electron transfer and higher efficiencies. The best efficiencies obtained from cells of this configuration are around 2%.

This technology shows promise, but there are obstacles to overcome. One problem is incomplete absorption of the incident radiation. The polymer—which absorbs light very strongly and is referred to as a polymeric dye—has a large extinction coefficient (>100,000 $M^{-1}$ $cm^{-1}$), but due to low exciton migration rates, the films must generally be thinner than 100 nm, which contributes significantly to incomplete absorption. This effect can be combated by means of an interdigitated array structure of donor and acceptor species.

4.2 Wide-Bandgap Nanocrystal/Light-Absorbing Nanocrystals/Hole Transfer Polymer A problem associated with the light-absorbing polymer strategy is underutilization of available solar energy due to the narrow absorption bandwidth of typical polymers. Approximately 40% of the light (from about 600 nm out into the near IR) can be wasted. An alternative configuration is to utilize nanocrystals as light absorbers and electron carriers, and employ the polymer as a light absorber and a hole carrier. CdSe nanorod and tetrapod/polymer systems have demonstrated power-conversion efficiencies of up to 1.7%. These systems have the advantage that the absorption of the nanocrystal can be tuned via the size of the nanocrystal, and systems that absorb essentially all of the incoming radiation can therefore be fabricated.

Unfortunately, it is difficult to disperse inorganic nanocrystals into a solution of monomers. The two phases tend to agglomerate and minimize the electrical contact essential to form the heterojunction which enables charge separation. Dispersion of nanocrystals in polymer phases is an area of great interest.

Typically, the strategy employed for dispersing the nanocrystals is to functionalize the nanocrystal with a capping agent that has an organic tail, which enhances solubility in the solvent in which the polymerization is carried out. Capping agents for this purpose typically have a head-group with a strong affinity for the nanocrystal; amine, carboxylate, phosphine, thiol, phosphine oxide and phosphonic acid, for example, all bind strongly. The organic tail of the capping agent should be compatible with solvents in which the polymer is soluble. Long hydrocarbon chains typically provide high solubility but are non-conducting; accordingly, it is necessary to balance optimum solubility against conductivity.

The most popular polymers used for composite studies are PDFC, P3Ht and MEH-PPV (where PDFC refers to -{poly[9,9-dihexylfluorenyl-2,7-diyl)-alt-co-(9-ethyl-3,6-carbazole)]}-, P3Ht refers to poly(3-hexylthiophene), and MEH-PPV refers to poly(2-methoxy-5-(2'-ethyl-hexyloxy)-1,4-phenylene vinylene)). Each of these polymers has sites for functionalization, allowing the manipulation of the valence/conduction band energies to achieve optimal conditions for charge transfer to and from the nanocrystals. It has been suggested that the capping agent may also serve as the organic acceptor phase; for example, P3HT functionalized with phosphonic acid groups has been shown to isolate CdSe nanocrystals.

5. Dye-Sensitized Solar Cells

DSSCs incorporate a substrate which has been coated with a transparent conducting oxide (which serves as the primary electrode). The counter electrode may also be coated with a transparent conducting oxide, but may also be a non-corrosive metal, such as titanium coated with a very thin layer of platinum. A porous layer of a wide-bandgap semiconductor (such as $TiO_2$) is deposited on the conductive surface of the primary electrode. This porous layer is then coated with a dye having a strong absorption in the visible region of the spectrum. To be optimally effective, the dye concentration should be limited to a monolayer of dye molecules. Because of this, a huge surface area is necessary to accommodate enough dye to absorb all of the incoming light. Therefore, nanocrystals (e.g., $TiO_2$) are used to make the highly porous films. Electrolyte containing a redox couple (typically $I^-/I_3^-$) is absorbed into the titania layer. To complete the cell, the substrate bearing the primary electrode and the sensitized titania layer is brought into face-to-face contact with the counter electrode.

Typical dyes are inorganic-ruthenium-based, although organic dyes are receiving increased interest. The dye absorbs visible light, and the excited state injects an electron into the $TiO_2$ conduction band. Before back electron transfer can occur, the oxidized dye is reduced by a redox active species in solution (typically $I^-/I_3^-$), regenerating the dye. The oxidized redox active species diffuses to the counter electrode, where it is reduced, finishing the cycle and completing the circuit. Work can be done by passing the injected electron through an external load before allowing it to reduce the oxidized redox active species at the counter electrode.

Inexpensive DSSC devices, which exhibit up to 10% energy conversion efficiency, can be fabricated. There are many issues to be addressed with this technology to improve performance and stability, including replacing the best performing liquid electrolytes with solid-state or higher-boiling electrolytes; improving spectral overlap; using a redox mediator with a lower redox potential; and lowering recombination losses due to poor electron conduction through the nanoparticle $TiO_2$ layer.

6. Hybrid Cells

Hybrid cells combine dye-sensitized titania, coated and sintered onto a transparent semiconducting oxide, with a p-type polymer that carries electrons to the oxidized dye. Since just one polymer replaces the multi-component electrolyte, these cells can be fabricated conveniently and reproducibly. Ruthenium dye-sensitized, nanorod-based DSSCs tend to exhibit low efficiency, however, because the lower surface area does not accommodate enough dye to absorb all of the incident light. The most efficient dyes found so far only have extinction coefficients on the order of ~20,000 $M^{-1}$ $cm^{-1}$, and therefore a large surface area is needed to bind enough dye to get maximal absorbance.

SUMMARY OF THE INVENTION

Aspects of the present invention provide a photovoltaic (PV) cell comprising a semiconducting nanorod-nanocrystal-polymer hybrid layer, as well as methods for fabricating the same. In PV cells according to this invention, the nanocrystals serve both as the light-absorbing material and as the heterojunctions at which the excited electron-hole pairs (i.e., excitons) split. The nanorods function as electron carriers and are electrically connected to the anode of the cell, and the polymer acts as the hole carrier and is electrically connected to the cathode of the cell.

One of the advantages of the invention lies in the use of small particles, the nanocrystals, as both light absorber and heterojunction. The resulting spatio-temporal proximity of exciton generation and splitting entails a significant reduction in recombination losses, compared, for example, with those of conventional polymer PV cells, and consequently in higher conversion efficiencies of photons into electricity. Embodiments of the invention offer the additional advantages of mechanical flexibility and low cost manufacturing processes.

Accordingly, in a first aspect, the invention provides a photovoltaic cell containing two electrodes and, in between these electrodes, a plurality of aligned semiconducting nanorods surrounded by and bound to a plurality of photoresponsive nanocrystals, and a semiconductor polymer surrounding the nanorods and bound to the nanocrystals. The nanocrystals act as heterojunctions channeling electrons into the nanorods and holes into the polymer, or vice versa. The nanorods are electrically connected to the first electrode, and electrically insulated from the second electrode by a thin layer of polymer bound to the second electrode. In various embodiments, the polymer is a hole-transfer polymer, and consequently, the nanocrystals channel holes into the polymer and electrons into the nanorods. In various embodiments, the nanocrystals are bound to the nanorods by a bifunctional capping agent, which can, for example, be mercaptoacetic acid. For example, the nanorods may be grown on the first electrode, and the other electrode can later be deposited on the nanorod-nanocrystal-polymer layer in a manner ensuring insulation of the nanorods from the second electrode.

Advantageous nanorods have aspect ratios (i.e., ratios of the longest dimension to the shortest dimension of the particle) of at least 3, and their shortest dimension is not greater than 100 nm. Preferred nanorods are single-crystalline. Suitable nanorod materials according to the invention include, but are not limited to, wide bandgap semiconductors such as, for example, ZnO, SnO, and $TiO_2$, whereby ZnO is the preferred material.

Suitable nanocrystals according to the invention include semiconducting, monocrystalline or polycrystalline nanoparticles of diameter not greater than 20 nm, which may (but need not) be generally spherical in shape. Suitable nanocrystal materials include, but are not limited to $CuInSe_2$, $CuInS_2$, $CuIn_{1-x}Ga_xSe_2$ (where $0 \leq x \leq 1$), GaAs, InAs, InP, PbS, PbSe, PbTe, GaSb, InSb, CdTe and CdSe. Nanocrystals with extinction coefficients of at least 100,000 $M^{-1}$ $cm^{-1}$ are preferred. In various embodiments, the largest spatial dimension of the nanocrystals is no greater than the average diffusion distance of the excitons created in the nanocrystal upon absorption of light.

Suitable polymer materials include, but are not limited to, poly(3-hexylthiophene), polyphenylenevinylene (PPV) and its derivatives, and polyfluorene (PFO) and its derivatives. In various embodiments, the polymer is bound to the nanocrystals but not to the nanorods.

In a second aspect, the invention provides a method of fabricating a semiconductor structure with heterojunctions; the structure can be used in a photovoltaic cell. Embodiments of the method involve providing a plurality of nanorods and a plurality of photoresponsive nanocrystals capped with a first capping agent; exposing the nanorods or the nanocrystals to a second, bifunctional capping agent; then combining the nanocrystals with the nanorods so that the nanocrystals bind to the nanorods via the bifunctional capping agent; combining the bound nanorods and nanocrystals with a functionalized monomer which has a binding group with (i) stronger affinity for the nanocrystals than the first capping agent and (ii) weaker affinity for the nanorods than the bifunctional capping agent, so that the monomer preferentially displaces the first capping agent and binds to the nanocrystals; and polymerizing the monomer. The bifunctional capping agent can first bind to the nanorods, and then bind to the nanocrystals, replacing some of the first capping agent. Alternatively, the bifunctional capping agent can first bind to the nanocrystals (replacing some of the first capping agent), and then bind with its free ends to the nanorods. In various embodiments, the first capping agent contains a thiol, selenol, amine, phosphine, phosphine oxide, and/or aromatic heterocycle functionality. A non-limiting example of a suitable capping agent is octanethiol.

BRIEF DESCRIPTION OF THE DRAWINGS

The foregoing discussion will be understood more readily from the following detailed description of the invention when taken in conjunction with the accompanying drawings.

DETAILED DESCRIPTION OF THE INVENTION

1. Nanorod-nanocrystal-polymer Hybrid Structure

In polymer-based photovoltaics, excitons travel on average of the order of 10 nm before recombining; accordingly, there is a need to separate the excitons, i.e., to have them encounter a heterojunction as soon as possible. This need is met in embodiments of the present invention, in which nanocrystals (quantum dots) serve as a bridge between a hole-transfer polymer and a wide-bandgap semiconductor electron acceptor, thus constituting the heterojunction, and serve simultaneously as the light absorber, i.e., the place where the excitons are created. The diameter of a nanocrystal according to the invention is approximately equal to, or smaller than, the diffusion distance of an exciton. As a result, an exciton generated in the nanocrystal will generally encounter the interface of the nanocrystal with the electron acceptor or the hole-transfer polymer within its average diffusion distance, regardless of the direction in which it migrates. Consequently, the exciton splits very efficiently, and recombination within the nanocrystal occurs infrequently. The electron enters into the wide-bandgap semiconductor, and the hole enters into the polymer.

Figure 1B:
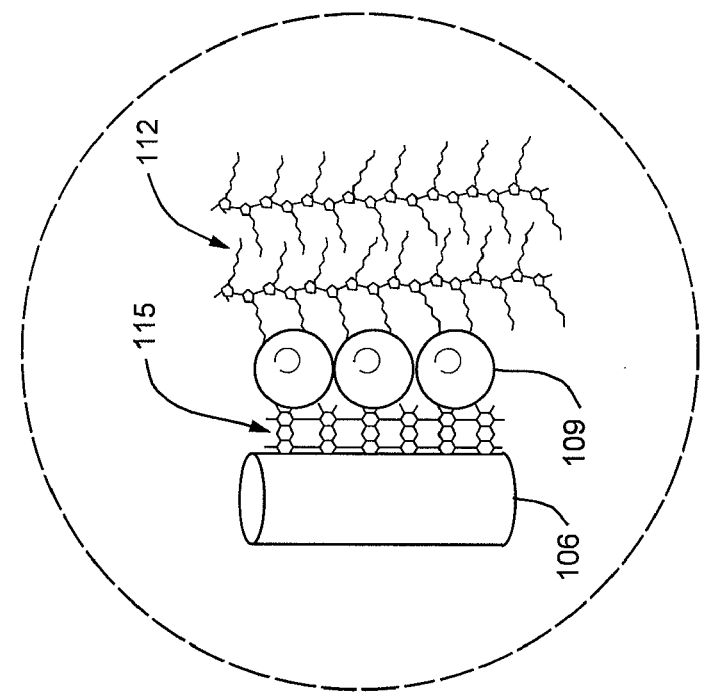
FIG. 1B is an enlarged schematic view of the three major components of the hybrid semiconductor layer of FIG. 1A, and of their interconnections.
Figure 1A:
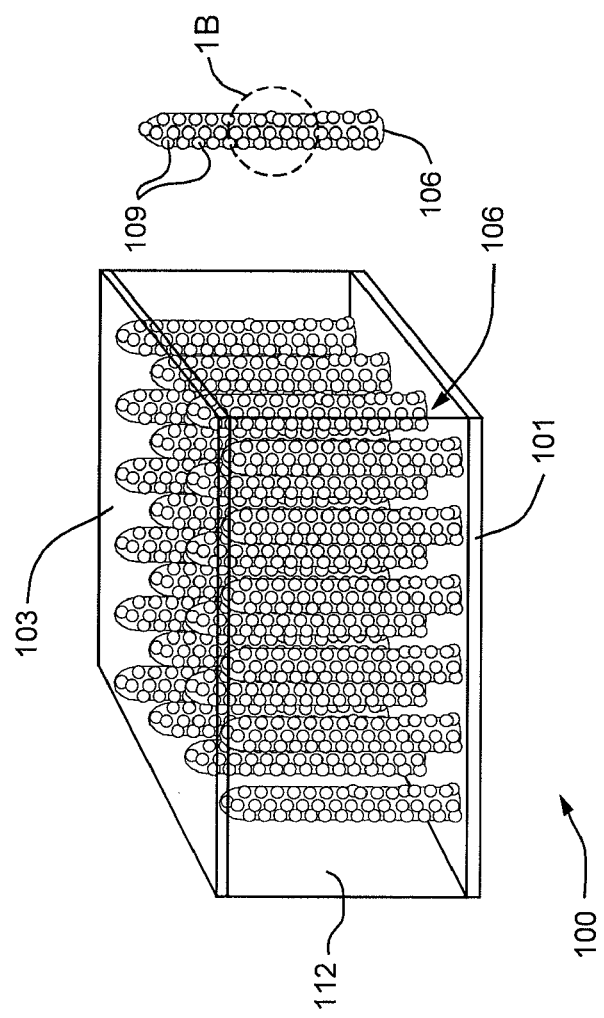
FIG. 1A schematically depicts an embodiment of a nanorod-nanocrystal-polymer hybrid solar cell according to the invention.

The structure of a PV cell 100 according to the invention is illustrated in FIG. 1A. In between two electrodes, an anode 101 and a cathode 103, a plurality of aligned wide-bandgap semiconductor nanorods 106, which constitute the electron acceptor, is arranged. As shown in the detail of FIG. 1A, the nanorods 106 are each surrounded by photosensitive nanocrystals 109. The sensitized nanorods, in turn, are surrounded by the hole-transfer polymer 112, which fills the remaining space between the electrodes 101, 103. The polymer 112 also forms a thin layer underneath the cathode 103, which electrically isolates the cathode 103 from the sensitized nanorods 106.

FIG. 1B shows how these three components are interconnected in preferred embodiments of the invention. The nanocrystals 109 are bound to the nanorods 106 by means of a bifunctional binding molecule 115. In various embodiments, the bifunctional capping agent 115 has thiol and carboxylate moieties. The thiol groups bind preferentially to the nanocrystals 109, and the carboxylate groups bind preferentially to the (metal oxide) nanorods 106. The intervening chain should be short enough so that charge transfer from nanocrystal 109 to nanorod 106 is not impeded. A representative bifunctional capping agent 115 is mercaptoacetic acid. The hole-transfer polymer 112 is directly bound to the nanocrystals 109, but preferably not to the nanorods 106.

A representative, non-limiting example of a system of nanorods, bifunctional molecules, nanocrystals, and polymers comprises ZnO nanorods capped with mercaptoacetic acid, $CuInSe_2$ quantum dots, and poly(3-hexylthiophene).

1.1 Nanocrystals 109

The semiconductor material used for nanocrystals in a particular application depends on the suitability of valence and conduction band energy levels. The conduction band should be of sufficient energy to be able to inject electrons efficiently into the nanorods, while the valence band should be of sufficiently low energy to inject holes into the polymer valence band. The latter constraint is generally straightforward to satisfy, as suitable polymers having a higher-energy valence band than the nanocrystal can readily be identified. Subject to the above constraints, the bandgap of the nanocrystal should be small enough to allow for a large portion of the solar spectrum to be absorbed. Suitable nanocrystal materials include materials based on copper-indium-diselenide and variants thereof, for example, $CuInS_2$, $CuInSe_2$, or $CuIn_{1-x}Ga_xSe_2$ (wherein $0 \leq x \leq 1$), as well as CdSe, GaAs, InAs, and InP.

Nanocrystals can be synthesized using techniques described, for example, in U.S. Pat. No. 6,379,635 and co-pending U.S. patent application Ser. Nos. 11/579,050 and 11/588,880, the entire contents of which are hereby incorporated by reference.

A method for producing CIGS nanocrystals of any desirable stoichiometry employing a selenol compound is disclosed in U.S. Provisional Application Ser. No. 60/991,510, the entire content of which is hereby incorporated by reference. Embodiments of the method involve dispersing at least a first portion of a nanocrystal precursor composition (comprising sources of at least one of Al, Ga, and/or In, and at least one of Cu, Ag, Zn, and/or Cd) in a solvent (e.g., a long-chain hydrocarbon solvent); heating the solvent to a first temperature for an appropriate length of time; adding a selenol compound to the solvent and heating the solvent; adding a second portion of the nanocrystal precursor composition to the reaction mixture; heating the mixture to a second temperature higher than the first temperature over an appropriate length of time; and maintaining the temperature for up to 10 hours. Once the particles have been formed, the surface atoms of the particles will typically be coordinated to a capping agent, which can comprise the selenol compound employed in the method. If a volatile selenol compound is used, this capping agent can be driven off with heating to yield 'naked' nanocrystals amenable to capping with other coordinating ligands and further processing. Examples 1 and 2 provide further details regarding the implementation of this method:

EXAMPLE 1

Cu(I) acetate (1 mmol) and In(III) acetate (1 mmol) are added to a clean and dry RB-flask. Octadecene ODE (5 mL) is added the reaction mixture heated at 100° C. under vacuum for 30 mins. The flask is back-filled with nitrogen and the temperature raised to 140° C. 1-octane selenol is injected and the temperature falls to 120° C. The resulting orange suspension is heated with stirring and a transparent orange/red solution is obtained when the temperature has reached 140° C. This temperature is maintained for 30 minutes, then 1M trioctyl-phoshine selenide TOPSe (2 mL, 2 mmol) is added dropwise and the solution heated at 160° C. The PL is monitored until it reaches the desired wavelength, after which it is cooled and the resulting oil washed with methanol/acetone (2:1) 4-5 times and finally isolated by precipitation with acetone.

EXAMPLE 2

Large Scale Production

A stock solution of TOPSe was prepared by dissolving Se powder (10.9, 138 mmol) in TOP (60 mL) under nitrogen. To dry, degassed ODE was added Cu(I) acetate (7.89 g, 64.4 mmol) and In(III) acetate (20.0 g, 68.5 mmol). The reaction vessel was evacuated and heated at 140° C. for 10 min, back-filled with $N_2$ and cooled to room temp. 1-Octane selenol (200 mL) was added to produce a bright orange suspension. The temperature of the flask was raised to 140° C. and acetic acid distilled from the reaction at 120° C. On reaching 140° C. the TOPSe solution was added dropwise over the course of 1 hour. After 3 hours the temperature was raised to 160° C. The progress of the reaction was monitored by taking aliquots from the reaction periodically and measuring the UV/Visible and photoluminescence spectra. After 7 hours the reaction was cooled to room temperature and the resulting black oil washed with methanol. Methanol washing was continued until it was possible to precipitate a fine black material from the oil by addition of acetone. The black precipitate was isolated by centrifugation, washed with acetone and dried under vacuum. Yield: 31.97 g.

For the purpose of optimizing the composition, size, and charge of the nanocrystals, they can be characterized by conventional techniques, including, but not limited to, XRD, UV/Vis/Near-IR spectrometry, SEM, TEM, EDAX, photoluminescence spectrometry, and elemental analysis.

Some embodiments of the invention utilize nanocrystals with extinction coefficients of at least 100,000 $M^{-1}$ $cm^{-1}$. At such high absorptivities, fewer nanocrystals are needed to achieve the same overall absorption. Consequently, embodiments of this invention based on these nanocrystals can benefit from increased absorption without incurring losses in efficiency due to enhanced recombination.

1.2 Nanorods 106

Nanorods can be produced by direct chemical synthesis, utilizing a suitable combination of ligands such as trioctylphosphine oxide (TOPO) and various phosphonic acids, e.g., octadecylphosphonic acid, for shape control. Moreover, different types of metal oxides can be grown in ordered nanorod arrays, using techniques such as, for example, electrochemical etching of metal foil, or substrate seeding followed by nanorod growth, in a chemical bath, in a direction perpendicular to the substrate. See, e.g., D. C. Olson et al., *J. Phys. Chem. C*, 2007, 111, 16640-16645; and J. Yang et al., *Crystal Growth & Design*, 2007, 12/2562, the disclosures of which are hereby incorporated by reference in their entireties.

In preferred embodiments of the invention, the nanorods have high aspect ratios exceeding 3, and are up to 200 nm long. A preferred nanorod material is ZnO. Other materials that might be suitable include SnO, $TiO_2$, and other metal oxides.

As mentioned previously, the small size of the nanocrystals greatly reduces recombination within the particle. In order to further reduce recombination losses, preferred embodiments of the invention utilize single-crystal nanorods. While in nanoporous particle-based films, such as those employed in DSSC cells, electrons percolate slowly through the film, enabling recombination with the electrolyte to take place, electron transfer through single-crystal nanorods is very fast, which limits the recombination of electrons from the nanorods with holes in the nanocrystals or the polymer.

In preferred embodiments and as discussed in greater detail below, the nanorods are coated with a layer of a bifunctional capping agent, which binds the quantum dots closely to the nanorods, thereby preventing the semiconductor polymer from coming into the proximity of the nanorod, which diminishes nanorod-polymer recombination losses even further.

1.3 Polymer 112

Polymer 112 should have a valence band energy that allows holes to efficiently transfer from the nanocrystal valence band to the polymer valence band. Suitable polymers include poly (3-hexylthiophene), polyphenylenevinylene (PPV) and its derivatives, and polyfluorene (PFO) and its derivatives. These polymers are efficient hole-transfer polymers due to the high hole mobility in organic materials.

2. Method for Fabricating a Nanorod-nanoparticle-polymer Hybrid Structure

Hybrid semiconductor structures according to the invention can be fabricated using low-cost deposition technologies, such as printing, dip coating, or chemical bath deposition. An important consideration regarding fabrication is control over where the various pieces bind together. For example, binding of the polymer to the nanorod would most likely result in substantial losses in efficiency due to recombination. In preferred embodiments, the nanocrystals are bound to both the nanorods and to the semiconducting polymer to promote optimal performance as a heterojunction, and the polymer is not directly bound to the nanorods. This structure can be achieved with suitable capping agents in appropriate processing steps.

Figure 2A:
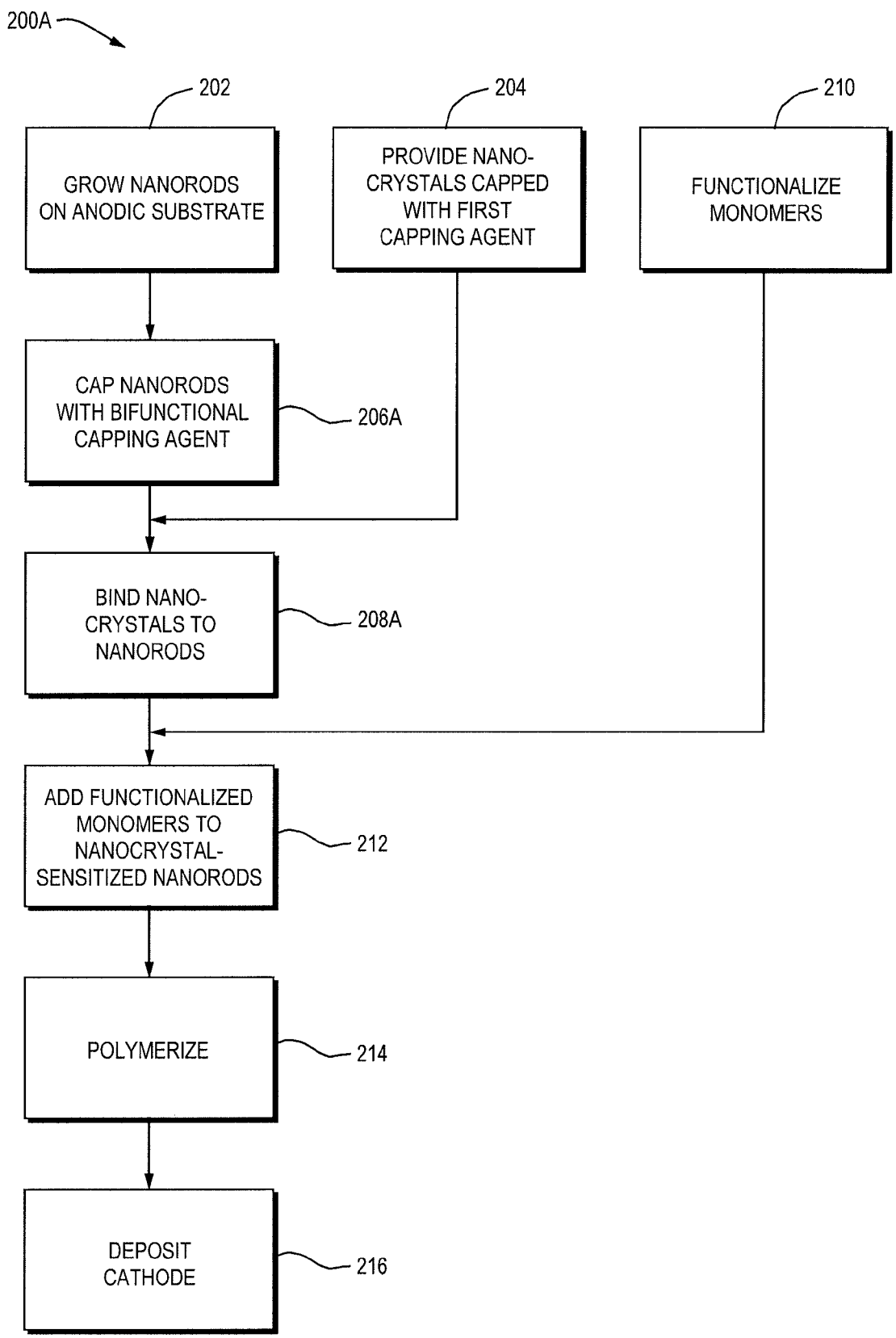
FIG. 2A is a flow diagram detailing a method of fabricating the structure depicted in FIG. 1A according to one embodiment.
Figure 2B:
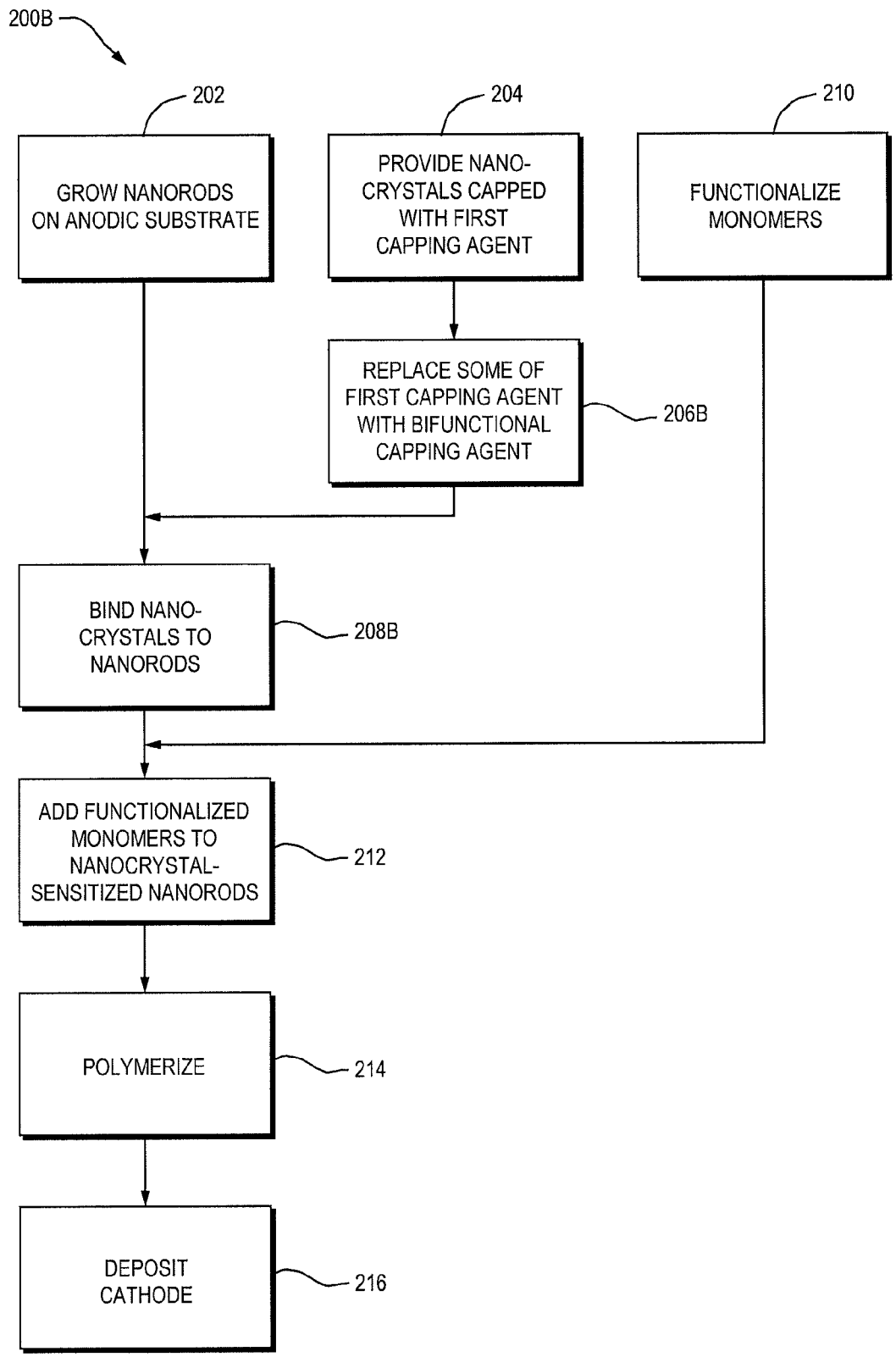
FIG. 2B is a flow diagram detailing a method of fabricating the structure depicted in FIG. 1A according to an alternative embodiment.

FIGS. 2A and 2B illustrate representative process sequences 200A and 200B implementing embodiments of the present invention. Some steps of these sequences, and the structures they result in, are further illustrated in FIG. 3 at a microscopic level. In a first step 202, nanorods are grown on an anodic substrate, e.g., by printing seeds on the substrate and then growing the nanorods perpendicularly to the substrate via a chemical bath. In this structure, the nanorods are inherently in electrical contact with the substrate. In subsequent steps, the nanocrystals and monomers are introduced to the resulting film of aligned nanorods.

In step 204, nanocrystals capped with a (first) capping agent which contains functionalities that bind weakly to the nanocrystals are provided. Suitable functionalities include thiol, selenol, amine, phosphine, phosphine oxide, and aromatic heterocycles. Typically, the nanocrystals are dissolved in a non-polar organic solvent. The capping agent serves to control binding of the nanocrystals to the nanorods and the polymer; the bond is reversible and the capping agent can later be exchanged for other ligands. Examples of capping agents suitable for use with $CuInSe_2$ nanocrystals are octanethiol or pyridine.

Figure 3:
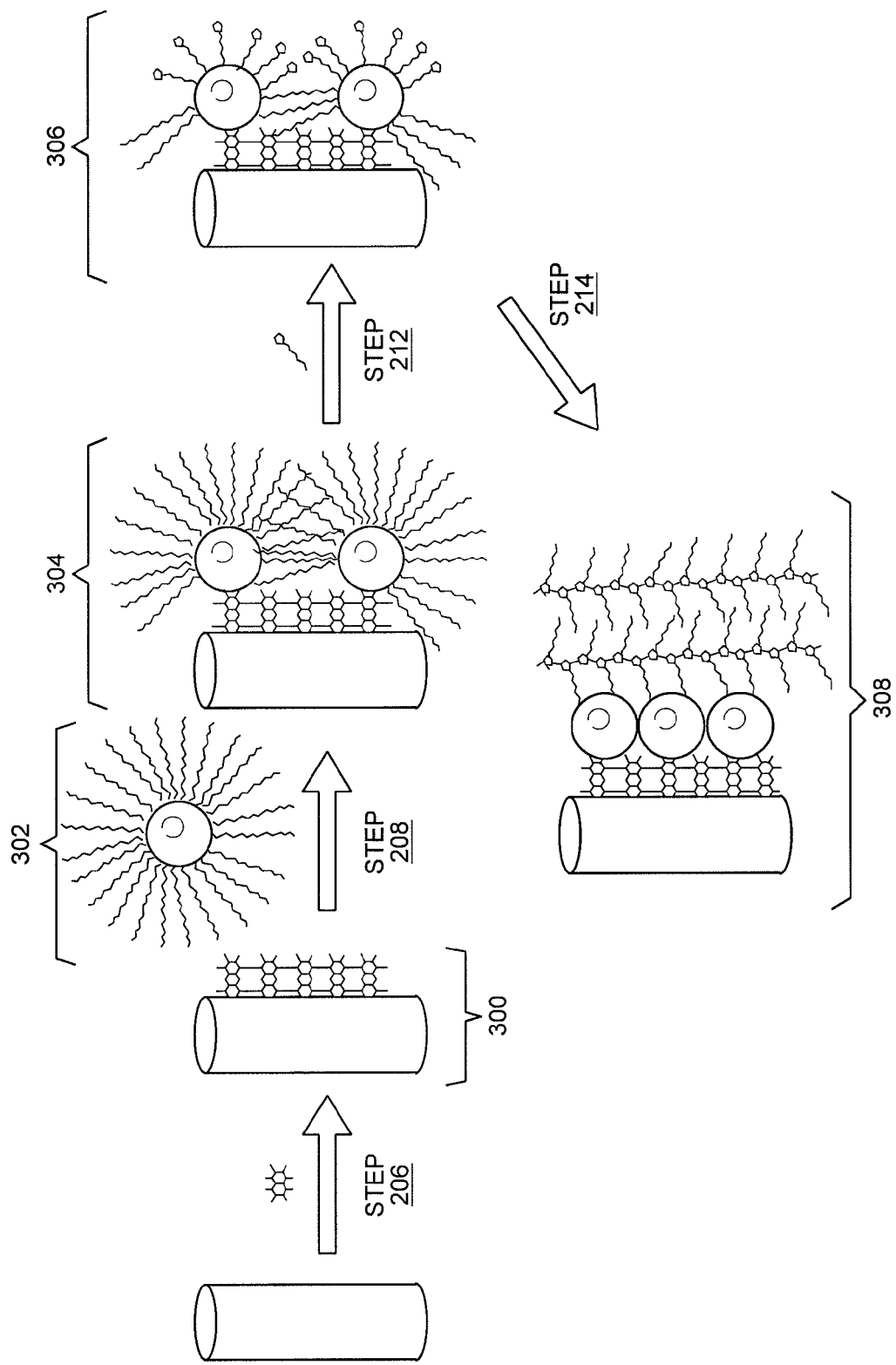
FIG. 3 illustrates at a microscopic level some of the steps of the method shown in FIG. 2 and the resulting products.

In steps 206, 208, the nanorods are coated by the nanocrystals, whereby the bond between nanorods and nanocrystals is established via the bifunctional capping agent 115 (e.g., mercaptoacetic acid), which has strong binding groups for both the nanorods and the nanocrystals. This can be accomplished in different ways. In some embodiments, as illustrated in FIG. 2A and FIG. 3, the nanorods are capped with the bifunctional capping agent (step 206A), for example, by dipping the substrate with the nanorods into a solution of the bifunctional capping agent. For example, the capping agent may be bound to the nanorods via a carboxylate functionality. The capped nanocrystals 302 are then introduced to the film of capped nanorods 300 (step 208A), for example, by dipping the rinced substrate with nanorods 300 into the nanocrystal solution(s). At this stage, a fraction of the weak capping agent of the nanocrystals is replaced by the stronger binding groups of the bifunctional capping agent, e.g., the thiol functionality of mercaptoacetic acid, which results in nanocrystal-sensitized nanorods 304.

In alternative embodiments, as illustrated in FIG. 2B, a solution of the capped nanocrystals in a non-polar organic solvent is added to a solution of the bifunctional capping agent in a polar organic solvent which is not miscible with the non-polar solvent, and the solution is shaken to ensure good mixing (step 206B). The nanocrystals undergo ligand exchange and transfer from a non-polar organic phase to a polar organic phase. Subsequently, the substrate with the aligned nanorods on the surface is dipped into the nanocrystal solution or otherwise exposed to the nanocrystals (step 208B), whereby the nanorods bind the nanocrystals via a carboxylic acid functionality of the capping agent. These embodiment likewise result in nanocrystal-sensitized nanorods 304.

The monomers are functionalized (step 210) with a binding group that has a stronger affinity for the nanocrystals than the (first) nanocrystal capping agent, but a weaker affinity for the nanorods than the bifunctional capping agent. Moreover, the affinity of the binding group at the monomer for the nanocrystal is preferably weaker than the affinity of the bifunctional capping agent for the nanocrystal. The monomer functionality should not interfere with the polymerization reaction. Binding groups with suitable differential binding affinities are straightforwardly identified by those of skill in the art without undue experimentation based on the identities of the capping agents and their substituents (e.g., whether they are unidentate or multidentate, or on the presence of electron withdrawing groups, etc.) and the size of the nanocrystal. The functionalized monomers are then combined with the nanocrystal-sensitized nanorods (step 212), where they bind to the nanocrystals (but not the nanorods), preferentially replacing the weak capping agent on the nanocrystal, but leaving the nanorod-nanocrystal bond intact, resulting in structure 306. A subsequent polymerization step 214 results in the nanorod-nanocrystal-polymer semiconductor structure 308.

Finally, a metal cathode (e.g., Al) can be deposited on the structure (step 216), for example, by sputtering or metal evaporation, so that the nanorods form an array of aligned rods deposited between two opposing electrodes. The polymer layer below the cathode should be sufficiently thick to electrically isolate the cathode from the nanorods.

Although the present invention has been described with reference to specific details, it is not intended that such details should be regarded as limitations upon the scope of the invention, except as and to the extent that they are included in the accompanying claims.

What is claimed is:

1. A method of fabricating a semiconductor structure comprising heterojunctions and being suitable for use in a photovoltaic cell, the method comprising the steps of:
    a. providing a plurality of nanorods and a plurality of photoresponsive nanocrystals capped with a first capping agent;
    b. exposing the nanorods or the nanocrystals to a second, bifunctional capping agent;
    c. thereafter combining the nanocrystals with the nanorods, whereby the nanocrystals bind to the nanorods via the bifunctional capping agent;
    d. combining the bound nanorods and nanocrystals with a functionalized monomer having a binding group, the binding group (i) exhibiting a stronger affinity for the nanocrystals than the first capping agent and (ii) exhibiting a weaker affinity for the nanorods than the bifunctional capping agent, whereby the monomer binds to the nanocrystals but not to the nanorods; and
    e. polymerizing the monomer.

2. The method of claim 1 further comprising the step of disposing the nanorods between first and second electrodes.

3. The method of claim 1 wherein providing a plurality of nanorods comprises growing a plurality of nanorods on a substrate providing a first electrode.

4. The method of claim 3 further comprising depositing a second electrode on a polymer layer resulting from the polymerizing the monomer.

5. The method of claim 1 wherein the first capping agent comprises at least one binding functionality selected from the group consisting of thiol, selenol, amine, phosphine, phosphine oxide, or an aromatic heterocycle.

6. The method of claim 5 wherein the first capping agent is octanethiol.

7. The method of claim 1 wherein step (b) comprises capping the nanorods with the second capping agent, whereby the second capping agent displaces at least a portion of the first capping agent.

8. The method of claim 1 wherein step (b) comprises exposing the nanocrystals to the second capping agent, the second capping agent replacing some but not all of the first capping agent on the nanocrystals, whereby in step (c) the the second capping agent binds to the nanorods.

* * * * *